United States Patent [19]
Yiu et al.

[11] Patent Number: 5,668,758
[45] Date of Patent: Sep. 16, 1997

[54] DECODED WORDLINE DRIVER WITH POSITIVE AND NEGATIVE VOLTAGE MODES

[75] Inventors: Tom Dang-Hsing Yiu, Milpitas, Calif.;
Chun-Hsiung Hung, Hsin-Chu, Taiwan; Ray-Lin Wan, Milpitas, Calif.;
Yao-Wu Cheng, Taipei, Taiwan;
Teruhiko Kamei, Yokohama, Japan

[73] Assignee: Macronix Int'l Co., Ltd., Hsinchu, Taiwan

[21] Appl. No.: 612,923

[22] PCT Filed: Jan. 26, 1995

[86] PCT No.: PCT/US95/01031

§ 371 Date: Mar. 5, 1996

§ 102(e) Date: Mar. 5, 1996

[87] PCT Pub. No.: WO96/23307

PCT Pub. Date: Aug. 1, 1996

[51] Int. Cl.[6] .................................................. G11C 7/00
[52] U.S. Cl. .................. 365/185.23; 365/185.16
[58] Field of Search ........................ 365/185.23, 230.06, 365/189.09, 226, 185.16

[56] References Cited

U.S. PATENT DOCUMENTS

| | | | |
|---|---|---|---|
| 4,823,318 | 4/1989 | D'Arrigo et al. | 365/185.23 |
| 4,888,734 | 12/1989 | Lee et al. | 365/185.02 |
| 4,888,735 | 12/1989 | Lee et al. | 365/185.02 |
| 5,136,541 | 8/1992 | Arakawa | 365/185.23 |
| 5,253,200 | 10/1993 | Arakawa | 365/185.23 |
| 5,253,202 | 10/1993 | Bronner et al. | 365/189.01 |
| 5,257,238 | 10/1993 | Lee et al. | 365/230.06 |
| 5,287,536 | 2/1994 | Schreck et al. | 365/230.06 |
| 5,291,446 | 3/1994 | Van Buskirk et al. | 365/189.09 |
| 5,311,480 | 5/1994 | Schreck | 365/230.06 |
| 5,319,604 | 6/1994 | Imondi et al. | 365/230.06 |
| 5,371,705 | 12/1994 | Nakayama et al. | 365/189.09 |
| 5,438,542 | 8/1995 | Atsumi et al. | 365/185.23 X |
| 5,513,147 | 4/1996 | Prickett, Jr. | 365/230.06 |
| 5,553,295 | 9/1996 | Pantelakis et al. | 365/218 X |
| 5,563,827 | 10/1996 | Lee et al. | 365/185.23 |
| 5,581,509 | 12/1996 | Golla et al. | 365/200 |
| 5,587,947 | 12/1996 | Chang et al. | 365/185.3 |

FOREIGN PATENT DOCUMENTS

| | | |
|---|---|---|
| 0525678 | 2/1993 | European Pat. Off. . |
| 0559995 | 9/1993 | European Pat. Off. . |

OTHER PUBLICATIONS

IEEE International Solid–State Circuits Conference "TP 2.7: A 55ns 0.35µm 5V-only 16M Flash Memory with Deep–Power-Down", ISSCC96/Session 2/Flash Memory/Paper TP 2.7, 1996.

*Primary Examiner*—Joseph A. Popek
*Attorney, Agent, or Firm*—Wilson, Sonsini Goodrich & Rosati

[57] ABSTRACT

Wordline driver circuitry drives a plurality of wordlines in a flash EEPROM memory array in a first mode which selects between a positive voltage and ground, and a second mode which selects between a negative voltage and ground. A first supply voltage selector supplies positive voltage during the first mode, and a second mode reference voltage, such as ground, in the second mode. A second supply voltage selector supplies the first mode reference voltage such as ground in the first mode, and the negative voltage during a second mode. An inverting driver has an input which receives a wordline select signal, and an output coupled to the wordline, a first supply voltage input connected to the first supply voltage selector, and second supply voltage input connected to the second supply voltage selector. The inverting driver couples the first supply voltage input to the wordline when the wordline select signal is in a low state, and couples the second supply voltage input to the wordline when the wordline select signal is in a high state. A second inverter is connected in feedback across the inverting driver to hold the input of the inverting driver at the value of the wordline select signal during the negative voltage decode. The wordline select signals come from an address decoder. An isolation circuit is provided between the address decoder and the input to the inverting driver to isolate the decoder from the negative voltages which appear on the output of the second inverter during the negative voltage decoding state.

23 Claims, 6 Drawing Sheets

FIG.—1

DECODED WORDLINE DRIVER WITH POSITIVE AND NEGATIVE VOLTAGE MODES

BACKGROUND OF THE INVENTION

1. Field of the Invention

The present invention relates to wordline drivers used in memory arrays which are capable of driving both positive and negative voltages on the wordlines; and more particularly to flash EEPROM devices which apply a negative voltage to individual wordlines during a program mode, and a positive voltage to individual wordlines during a read mode.

2. Description of Related Art

In nonvolatile semiconductor memory devices known as flash EEPROM, positive and negative voltages are used to read and write data into the nonvolatile memory array. The writing of data into the nonvolatile memory array for flash EEPROM devices involves processes known as the program and erase modes. The erase mode involves setting an entire array, or at least a sector of an array, to a single state, in which either all of the cells in the array (or sector) have a low threshold or all of the cells in the array (or sector) have a high threshold. Whether the erased state is a high threshold state, in which the floating gate of the flash EEPROM cell is charged or a low threshold state in which the floating gate is discharged, depends on the particular implementation of flash memory. The programming mode involves charging or discharging the floating gate of individual addressed cells in the array to establish the opposite threshold level with respect to the erased state.

It is well known that in order to discharge the floating gate, it is advantageous to apply a negative voltage to the wordline for the cell to be discharged. This assists in driving electrons out of the floating gate into the source or drain regions of the cell, which are biased to a positive level to attract the electrons. However, circuitry for applying a negative voltage to a wordline presents some difficulties.

Wordline drivers must be capable of driving a positive voltage during a normal read mode for the device to selected wordlines in response to decoded addresses. It has proved difficult in the prior art to provide a wordline driver with the simple circuitry that can also apply a negative voltage to selected the wordlines. Prior systems for applying negative voltages to the wordlines have overridden the decoding function which drives the wordline driver, making it impossible to selectively apply negative voltages to individual wordlines. See, for instance, European Patent Application No. 92112727.0 entitled NON-VOLATILE SEMICONDUCTOR MEMORY DEVICE HAVING ROW DECODER, invented by Atsumi, et al. (Publication No. 0 525 678 A2); and European Patent Application No. 92830115.9, entitled DECODER CIRCUIT CAPABLE OF TRANSFERRING POSITIVE AND NEGATIVE VOLTAGES, invented by Gastaldi (Publication No. 0 559 995 A1). In both of these European patent applications, a wordline driver is disclosed which provides a positive voltage to selected wordlines for normal read mode operations, but overrides the selecting function of the decoder during an erasing mode to apply a negative voltage to all wordlines. Negative wordline voltages are not used during programming in these references. Because the decoding function is overridden, the negative wordline voltage cannot be applied during a program mode that relies on the decoding function.

When it is necessary to apply a negative voltage during a program mode to reduce high voltage requirements on the source and/or drain in flash EEPROM, the design of the wordline driver becomes difficult. Thus, for instance, separate drivers, one for positive voltage and one for negative voltage, at opposite ends of the wordline and each coupled to the decoding circuit have been used. For instance, Arakawa, U.S. Pat. No. 5,136,541, entitled PROGRAMMABLE READ ONLY MEMORY USING STACKED-GATE CELL ERASABLE BY HOLE INJECTION, and Arakawa, U.S. Pat. No. entitled 5,253,200 ELECTRICALLY ERASABLE AND PROGRAMMABLE READ ONLY MEMORY USING STACKED-GATE CELL, describe a system for driving a wordline with a positive and negative voltage based on the use of separate drivers. (See, for instance, FIG. 3 of Arakawa's U.S. Pat. No. 5,136,541).

U.S. Pat. No. 5,311,480 entitled METHOD AND APPARATUS FOR EPROM NEGATIVE VOLTAGE WORDLINE DECODING, invented by Schreck, describes a system in which each wordline has an independent negative voltage charge pump in order to provide for decoding in a negative voltage and positive voltage state. However, when a single negative voltage source is coupled to a plurality of wordline drivers, all wordlines are driven negative at the same time. Thus, the Schreck circuit is impractical in large memory systems because of the expense and complexity in repeating large numbers of charge pumps on a single chip.

It is desirable to provide a simplified wordline driver capable of selectively applying positive or negative voltages to a wordline during a program mode in a flash EEPROM device, or otherwise to the wordline in a memory array.

SUMMARY OF INVENTION

The present invention provides an apparatus for driving a selected wordline in a plurality of wordlines in a memory array in a first mode which selects between a positive voltage and ground, and a second mode which selects between a negative voltage and ground for the selected wordline. Thus, invention may be characterized as comprising a positive voltage source and a negative voltage source. A first supply voltage selector supplies a positive voltage during the first mode, and a second mode reference voltage, such as ground, in the second mode. A second supply voltage selector supplies the first mode reference voltage such as ground in the first mode, and the negative voltage during a second mode. An inverting driver on each wordline has an input which receives a wordline select signal, and an output coupled to the wordline. A first supply voltage input in the driver is connected to the first supply voltage selector. A second supply voltage input in the driver is connected to the second supply voltage selector. The inverting driver couples the first supply voltage input to the wordline when the wordline select signal is in a low state, and couples the second supply voltage input to the wordline when the wordline select signal is in a high state. A second feedback inverter has an input coupled to the wordline, and an output coupled to the input of the inverting driver. It is connected in feedback across the inverting driver to hold the input of the inverting driver at the value of the wordline select signal during a negative voltage decode. The feedback also holds the wordline select signal value during positive voltage decodes, allowing multiple wordlines to be brought to high voltage at the same time.

The wordline select signals come from an address decoder. An isolation circuit is provided between the address decoder and input to the inverting driver to isolate the decoder from the negative voltages which might appear on the output of the feedback inverter during a negative voltage decoding state.

The inverting driver comprises a p-channel MOS transistor in series with an n-channel MOS transistor. The n-channel MOS transistor is formed in an isolated p-well. It comprises n-type source and drain diffusion regions in a p-type well, the p-type well formed within an n-type well, and the n-type well in a p-type substrate. The n-type well is coupled to a positive supply voltage to isolate the p-type well during the negative voltage decoding mode.

The present invention is particularly applied for a negative wordline voltage program mode in flash EEPROM devices. Thus, the present invention can be characterized as an apparatus responsive to an address to drive a particular wordline in a flash EEPROM memory array with a positive voltage during a read mode, and with a negative voltage during a program mode. In this aspect, the system includes a positive voltage source and a negative voltage source. A decoder receives an address and generates a plurality of wordline select signals in response to the address. Each wordline select signal corresponds to a wordline in the plurality of wordlines in the flash EEPROM device. A plurality wordline drivers are provided, coupled to corresponding wordline select signals. These drivers are implemented as described above in a way that allows positive and negative decoding modes using one decoded driver per wordline and a single negative voltage source for plurality of decoded drivers.

Accordingly, the present invention provides a compact decoded wordline driver which can be used in a flash EEPROM device for providing positive and negative decode modes. This system is small, operates with great efficiency, and eliminates complex circuitry of prior art systems.

Other aspects and advantages of the present invention can be seen upon review of the figures, the detailed description and the claims which follow.

DETAILED DESCRIPTION OF PREFERRED EMBODIMENTS

A detailed description of preferred embodiments of the present invention is provided with reference to FIGS. 1–8.

Figure 1:
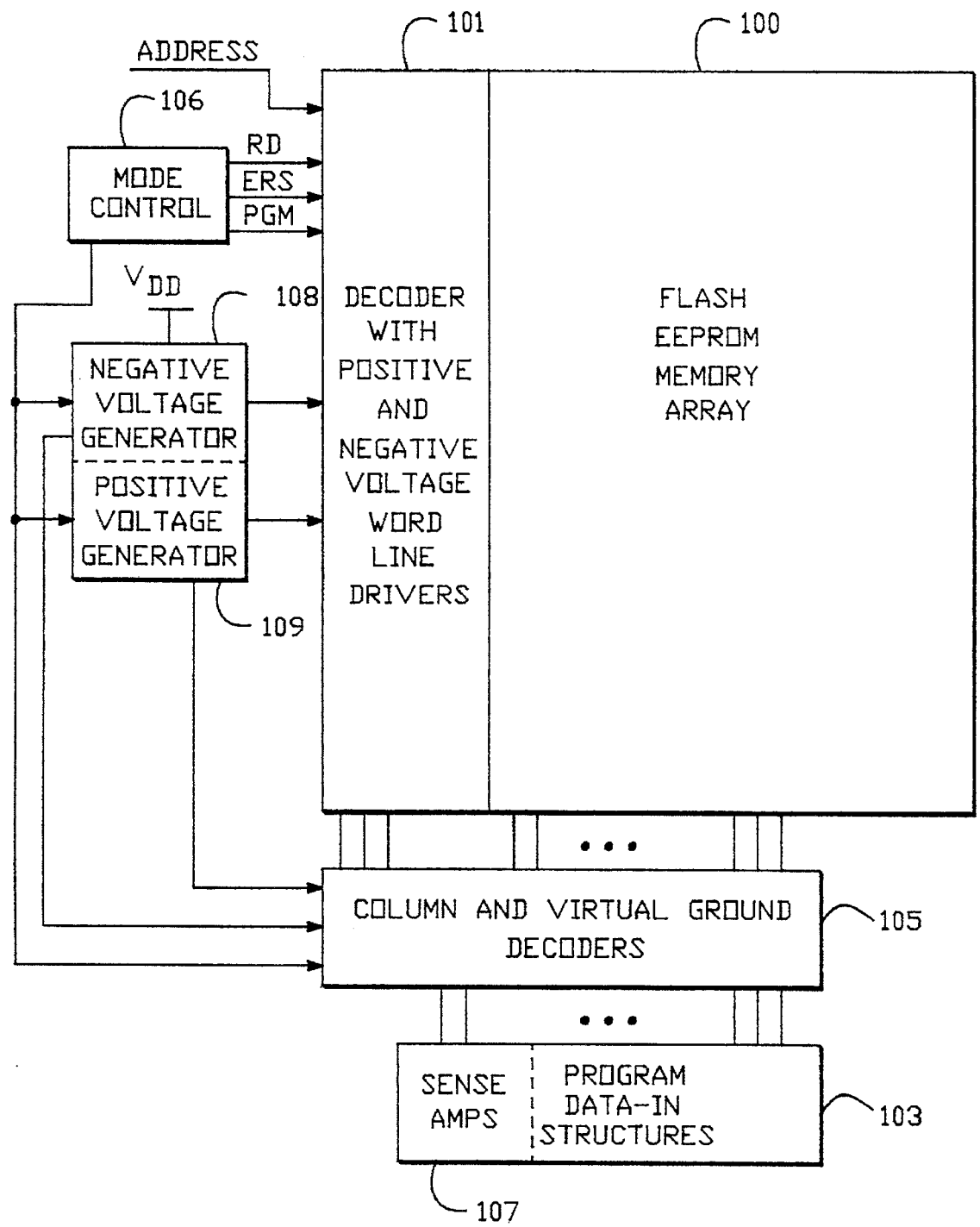
FIG. 1 is a schematic diagram of a Flash EEPROM device including a decoder with positive and negative voltage wordline drivers according to the present invention.
Figure 2:
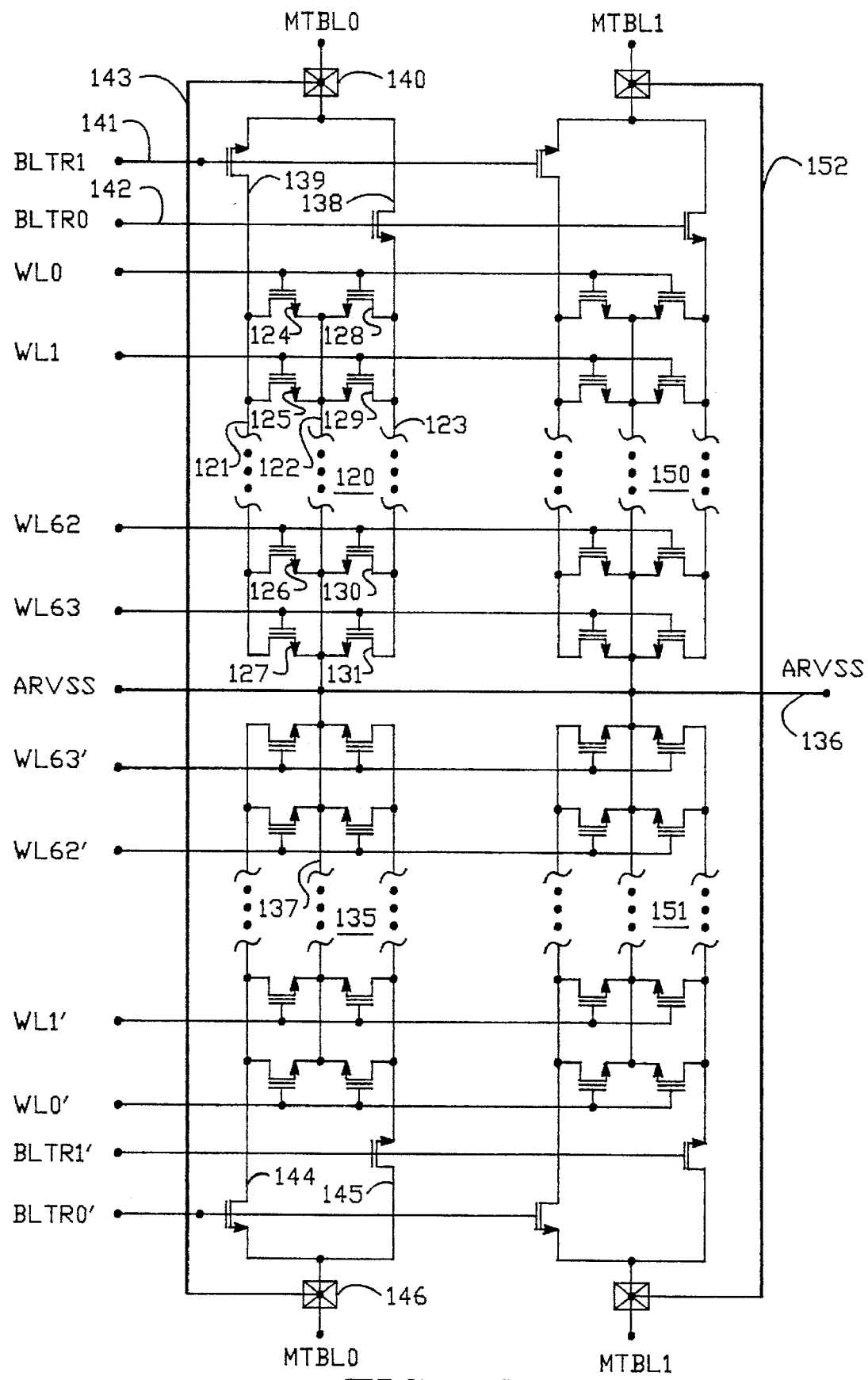
FIG. 2 is an illustration of a Flash EEPROM array for use in the device of FIG. 1.

In FIG. 1, a Flash EEPROM device is shown, which includes a Flash EEPROM array 100, which might be implemented as shown in FIG. 2. Coupled to the Flash EEPROM array are a decoder 101, which has positive and negative voltage wordline drivers. A mode control circuit 106 is coupled to the negative voltage generator 108, positive voltage generator 109, and column and virtual ground decoders 105 to provide a read RD, a program PGM, and an erase ERS mode for the Flash EEPROM device. A negative voltage generator 108 and a positive voltage generator 109 are also coupled with the decoder.

Column and virtual ground decoders 105 are coupled to the bitlines in the array as shown, and to the negative voltage generator 108 and positive voltage generator 109. Finally, sense amps 107 and program data-in structures 103 are coupled to the column and virtual ground decoders 105 for use in programming and reading the array.

FIG. 2 illustrates one embodiment of a Flash EEPROM array which might be used with the system of FIG. 1. FIG. 2 shows two pairs of columns of the array, where each pair of columns includes flash EEPROM cells in a drain-source-drain configuration.

Thus, the first pair 120 of columns includes a first drain diffusion line 121, a source diffusion line 122, and a second drain diffusion line 123. Wordlines WL0 through WL63 each overlay the floating gates of a cell in a first one of the pairs of columns and a cell in the second one of the pairs of columns. As shown in the figure, a first pair 120 of columns includes one column including cell 124, cell 125, cell 126, and cell 127. Not shown are cells coupled to wordlines WL2 through WL61. The second one of the pair 120 of columns includes cell 128, cell 129, cell 130, and cell 131. Along the same column of the array, a second pair 135 of columns is shown. It has a similar architecture to the pair 120 of columns except that it is laid out in a mirror image.

Thus, as can be seen, the transistor in the first one of the pair of columns, such as the cell 125, includes a drain in drain diffusion line 121, and a source in the source diffusion line 122. A floating gate overlays the channel region between the first drain diffusion line 121 and the source diffusion line 122. The wordline WL1 overlays the floating gate of the cell 125 to establish a flash EEPROM cell.

The column pair 120 and column pair 135 share an array virtual ground diffusion 136 (ARVSS). Thus, the source diffusion line 122 of column pair 120 is coupled to the ground diffusion 136. Similarly, the source diffusion line 137 of column pair 135 is coupled to the ground diffusion 136.

As mentioned above, each pair 120 of columns of cells shares a single metal line. Thus, a block right select transistor 138 and a block left select transistor 139 are included. The transistor 139 includes a source in the drain diffusion line 121, a drain coupled to a metal contact 140, and a gate coupled to the control signal BLTR1 on line 141. Similarly, the right select transistor 138 includes a source in the drain diffusion line 123, a drain coupled to the metal contact 140, and a gate coupled to the control signal BLTR0 on line 142. Thus, the select circuitry, including transistors 138 and 139, provides for selective connection of the first drain diffusion line 121 and a second drain diffusion line 123 to the metal line 143 (MTBL0) through metal contact 140. As can be seen, column pair 135 includes left select transistor 144 and right select transistor 145 which are similarly connected to a metal contact 146. Contact 146 is coupled to the same metal line 143 as is contact 140 which is coupled to column pair 120. The metal line can be shared by more than two columns of cells with additional select circuitry.

Column pairs are laid out horizontally and vertically to provide an array of flash EEPROM cells comprising M wordlines and 2N columns. The array requires only N metal bit lines each of which is coupled to a pair of columns of flash EEPROM cells through select circuitry, as described above.

Although the figure only shows four sub-blocks 120, 135, 150, and 151, coupled to two metal bit lines 143 and 152 (MTBL0–MTBL1), the array may be repeated horizontally and vertically as required to establish a large scale flash EEPROM memory array. Thus, column pairs 120 and 150 which share a wordline are repeated horizontally to provide a segment of the array.

Figure 3:
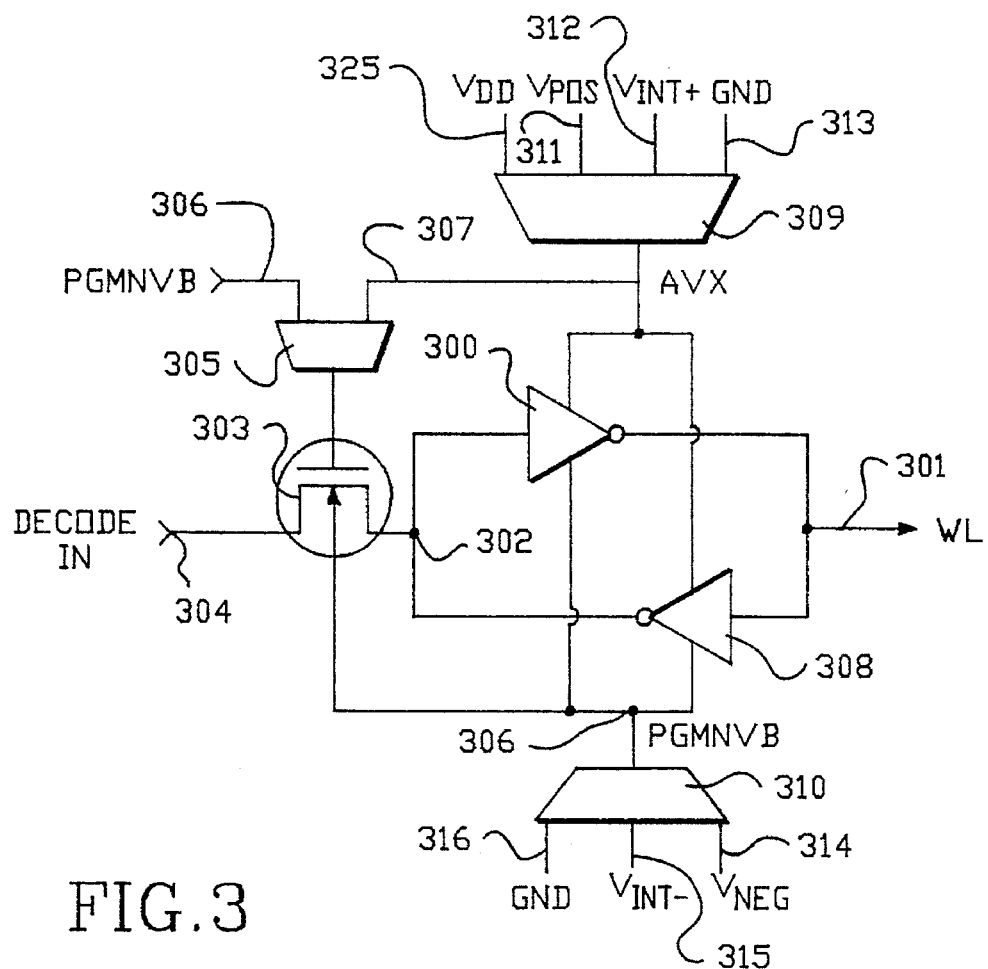
FIG. 3 is a schematic diagram of a wordline driver according to the present invention.

FIG. 3 provides a basic block diagram of the wordline driver according to the present invention. The wordline driver includes a driver circuit which is implemented with inverter 300 having its output connected to wordline 301 and its input connected to node 302, which receives a wordline select signal from a decoder through an isolation circuit composed of transistor 303 formed in an isolated p-well. Transistor 303 has its source connected to node 302 and its drain connected to the decode input 304. The gate of transistor 303 is connected to a selector 305 which supplies either the signal PGMNVB on line 306 or the signal AVX on line 307. The driver also includes circuitry for holding the value of the wordline select signal at node 302 when the isolation transistor 303 is non-conducting. This circuit consists of inverter 308 which has its input connected to the wordline 301, and its output connected to node 302. Thus, the combination of inverters 300 and 308 form a storage element.

The power supply voltages AVX and PGMNVB are supplied through power supply selector circuitry 309 and 310, respectively. Although not shown, the selectors 309 and 310 are shared by a plurality of wordline drivers.

The selector 309 supplies a signal AVX On line 307 from among positive supply voltage $V_{DD}$ on line 325, a high positive voltage $V_{POS}$ on line 311, one or more intermediate positive voltages $V_{INT+}$ on line 312, and ground on line 313, which provides a reference potential. The selector 310 selects from among a negative potential $V_{NEG}$ on line 314, one or more intermediate negative voltages $V_{INT-}$ on line 315, and ground on line 316.

The inverter 300 operates to select either the value AVX for connection to the wordline 301, or the value PGMNVB for connection to the wordline 301 depending on the value of the wordline select signal from the decoder on line 304. A more detailed description of the implementation of the driver is described below with reference to FIG. 5. The selectors 309, 310, and 305 are operated to establish a program mode, a read mode, and an erase mode under control of a mode control state machine on the chip.

During the erase mode, the selector 309 is operated to supply the high positive potential $V_{POS}$ to line 307 as the signal AVX. The selector 310 is operated to supply ground to line 306 as the signal PGMNVB. The selected wordline (i.e. wordlines in a sector to be erased during the erase mode) are charged to a +12 volts ($V_{POS}$) in the example described, while wordlines not selected are coupled to ground.

During the read mode, selector 309 is operated to supply the value $V_{DD}$ as the signal AVX, and the selector 310 is operated to supply ground.

During the program mode, according to the present invention, the selector 309 is operated to supply ground as the signal AVX, and the selector 310 is operated to supply the signal $V_{NEG}$ as the signal PGMNVB on line 306. There is also an intermediate mode during which the selectors 309 and 310 are operated to select the signals $V_{INT+}$ and $V_{INT-}$ during a transition from a read mode to a program mode, as explained in more detail below.

The selector 305 is operated to supply the signal AVX to a gate of transistor 303 during the read and erase modes, to leave transistor 303 in a conducting state. During the program mode, the signal PGMNVB on line 306 is applied to the gate. This is guaranteed to be as low as or lower than the value on node 302, mining off transistor 303, and isolating node 302 from the decoder.

Figure 4:
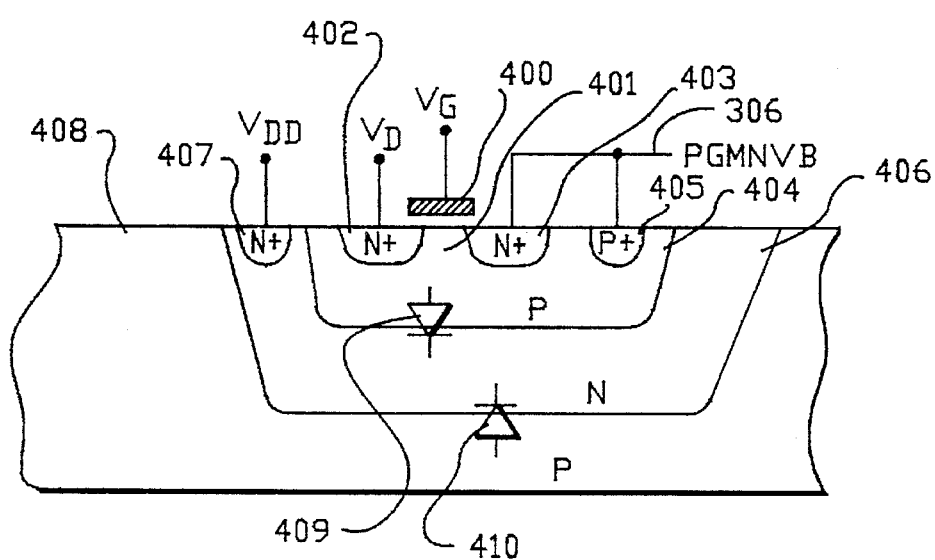
FIG. 4 illustrates isolated n-channel transistor which is used in the driver of FIG. 3.

The inverters 300 and 308 are composed of a p-channel transistor in series with an n-channel transistor. The n-channel transistor for both inverters is implemented in an isolated p-well, like transistor 303. The structure for this type of n-channel transistor is illustrated in FIG. 4. In particular, the transistor is composed of a gate terminal 400 over a channel region 401 which is formed between n-type diffusion regions 402 and 403 operating as the drain and source, respectively, of the transistor. The n-type diffusion regions 402 and 403 are implemented in the isolated p-type well 404. The p-type well has a contact at point 405 which is connected to the PGMNVB value on line 306. The source terminal 403 may or may not be connected to the line 306, depending on the particular application of the transistor. For instance, transistor 303 is not so connected.

The p-type well 404 is, in turn, formed in an n-type well 406, which has contact 407 to a positive supply vokage $V_{DD}$. The n-type well 406 is, in turn, formed in a p-type substrate 408. The structure establishes a p-n junction, schematically represented by the diode symbol 409 between the p-well 404 and the n-well 406. When negative voltages are applied to the p-well 404, this junction is reversed biased, isolating the n-well from the negative voltage. Similarly, a p-n junction represented by the diode symbol 410 is formed between the p-type substrate and the n-well 406. By biasing the n-well 406 with a positive voltage, this junction 410 is reversed biased, isolating the entire structure from the substrate.

Figure 5:
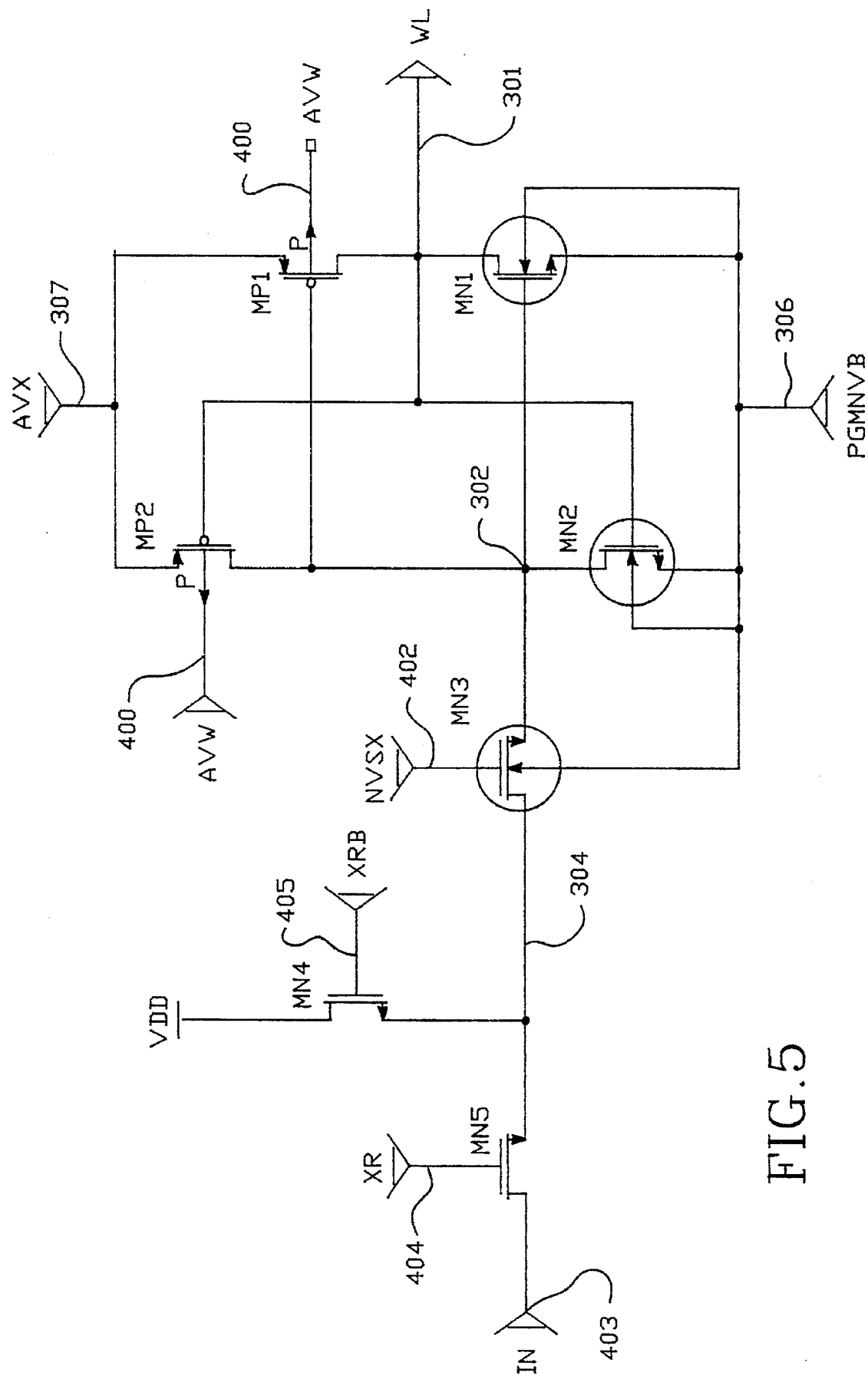
FIG. 5 is an electrical schematic diagram of a wordline driver according to the present invention.

FIG. 5 provides an electrical schematic diagram of the wordline driver shown schematically in FIG. 3. The nodes AVX 307, PGMNVB 306, the decode input 304, and the wordline 301 are given the same reference numbers, as are used in FIG. 3. The inverter 300 of FIG. 3 is implemented by transistors MP1 and MN1. Transistor MP1 is a p-channel transistor 45 microns wide and 1.2 microns long. It is formed in an n-well which is biased by the voltage AVW on line 400. The n-channel transistor MN1 is implemented as shown above with respect to FIG. 4, with its isolated p-well coupled to its source and to the terminal PGMNVB on line 306. The n-channel transistor MN1 is 55 microns wide and 1.2 microns long.

The gates of transistors MP1 and MN1 are connected to node 302. Node 302 is connected to the source of isolation transistor MN3 (corresponding to transistor 303 of FIG. 3). The drain of isolation transistor MN3 is connected to node 304. The gate of isolation transistor MN3 is the NVSX signal on line 402 which is supplied at the output of the selector 305 of FIG. 3. The isolation transistor MN3 is 20 microns wide and 1.2 microns long.

The inverter 308 of FIG. 3 is implemented with p-channel transistor MP2 and n-channel transistor MN2. The p-channel transistor MP2 is formed in an n-well which is biased at the level AVW on line 400. The source of MP2 is connected to node 307 to receive the value AVX. The drain is connected to node 302. The n-channel transistor MN2 has its drain connected to node 302, its source connected to node 306, and its gate connected to line 301. Similarly, the gate of transistor MP2 is connected to line 301. The isolated p-well of transistor MN2 is connected to node 306. Transistor MP2 is 3 microns wide and 4 microns long. Also, transistor MN2 is 3 microns wide and 4 microns long.

The wordline select signal on line 304 is generated in response to the signal IN on line 403, and the decode signals XR on line 404 and XRB on line 405. The signal IN on line 403 is connected to the drain of n-channel transistor MN5 which is 20 microns wide and 1.0 microns long. The source of transistor MN5 is connected to node 304. The gate of transistor MN5 is connected to line 404 to receive decode signal XR.

The XRB signal on line 405 is connected to the gate of n-channel transistor MN4. The drain of transistor MN4 is connected to the supply voltage $V_{DD}$. The source of transistor MN4 is connected to node 304. Transistor MN4 is 10 microns wide and 1.0 microns long. These n-channel transistors are not formed in isolated p-wells, because they are protected from negative voltages by the isolation transistor MN3.

Figure 6:
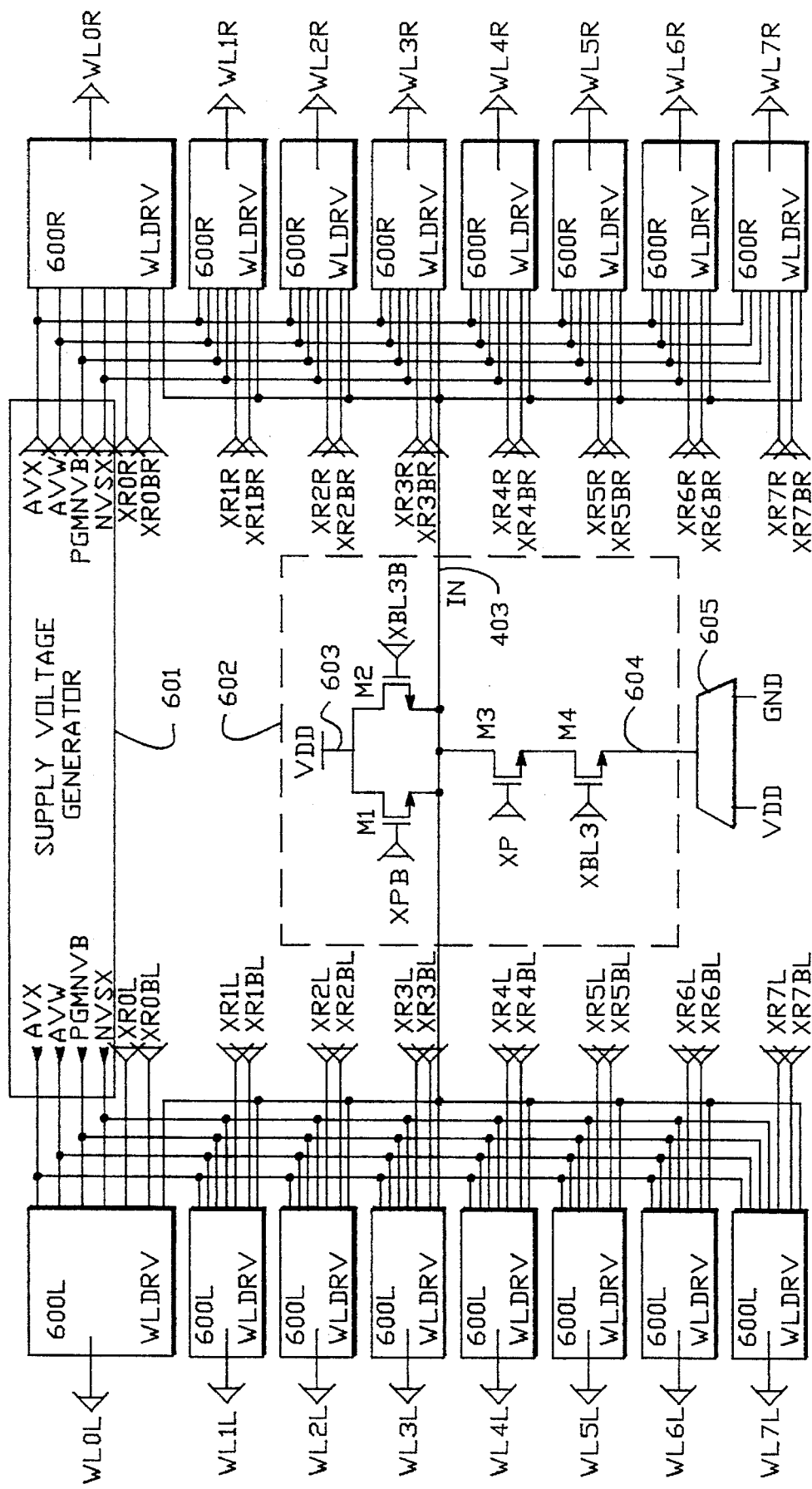
FIG. 6 is an electrical schematic diagram of a decoder having a positive voltage mode and a negative voltage mode according to the present invention for use with the wordline driver of FIG. 5.

FIG. 6 illustrates the circuitry for generating the signal IN on line 403. In FIG. 6, an array of wordline drivers such as shown in FIG. 5 are illustrated. Each wordline driver is given reference number 600L or 600R for the left and right sides respectively. The left and right sides drive the same wordline. The reference of voltages AVX, AVW, PGMNVB, and NVSX are supplied by the supply selector circuitry schematically represented by box 601. An address decoder described below generates the signals XR(N)R for the right side drivers, and XR(N)L for the left side drivers, and complement signals XR(N)BR and XR(N)BL.

The IN signal is supplied on line 403 by the select circuitry, generally 602. The circuitry 602 has a first supply node 603 coupled to the supply $V_{DD}$, and a second supply node 604 coupled to a selector 605 which supplies either $V_{DD}$ or ground depending on the mode of operation. In the read and erase mode (positive decode mode), node 604 is ground. In the program mode (negative decode mode), node 604 is coupled to the supply voltage $V_{DD}$.

The circuitry 602 consists of an all n-channel NAND gate structure having transistor M1 and transistor M2 coupled in parallel between node 603 and line 403. The transistors M3 and M4 are connected in series between node 403 and node 604. The gate of transistor M1 is coupled to the decode signal XPB. The gate of transistor M2 is coupled to the decode signal XBL3B. The gate of transistor M3 is connected to the decode signal XP and the gate of transistor M4 is connected to the decode signal XBL3. Transistors M1 through M4 are all n-channel transistors 20 microns wide and 0.8 microns long.

XP and XPB are true and complement versions of the same signal. Similarly, XBL3 and XBL3B are true and complement versions of the same signal. Thus, when both XP and XBL3 are high, node 403 is coupled to node 604. Transistors M1 and M2 are off. When XP and XBL3 are low, node 403 is coupled to node 603, and transistors M3 and M4 are off. XP-XPB, XBL3-XBL3B and XR(N)L/R-XR(N)LB/RB (which are normally true and complement versions of the same signals) can also be operated to control of the wordlines by forcing XPB, XBL3B and XR(N)LB/RB to ground and decoding XP, XBL3, and XR(N)L/R in various modes as mentioned below.

The wordline drivers 600 operate in three modes:
A. "READ"

In the read mode, the decoder applies a positive voltage, setting a selected wordline to $V_{DD}$. Only one wordline is selected to AVX which is set at $V_{CC}$. The other wordlines are set at PGMNVB which is set at ground. At this state, the signals XP and XPB, XBL3 and XBL3B, and XR and XRB are the true and complement versions of the same signals. The line 604 is selected to ground in this state.

B. "ERASE"

In the erase mode, the decoder applies a positive voltage to selected wordlines at the high erase voltage level. Multiple wordline drivers, where each wordline driver may drive eight or more wordlines, are connected to the high erase voltage at the AVX terminal. A wordline set sequence is used to latch the address decoder input data. The signals XPB, XBL3B, and XRB are grounded. Line 604 of FIG. 6 is set to ground. The signals XP, XBL3, and XR are decoded to latch a specified address so that the associated wordline driver is connected to AVX. The signal XR is grounded. The value of AVX is switched from the $V_{DD}$ level to the high erase voltage.

C. "PROGRAM"

In program mode, the decoder applies a negative voltage to a selected wordline, where the negative is the high negative voltage generated at PGMNVB. Thus, a selected wordline is connected to PGMNVB, while all others are coupled to AVX. The programming sequence is as follows:

In the wordline set mode WLSET, all the wordlines are set to high read voltage $V_{DD}$. To do this, XPB, XBL3B, and XR(N)LB/RB are grounded, the signal AVX is set at 5 V, AVW is set at 5 V, PGMNVB is set at 0 V, and a state machine controls the signals XP and XBL3 to sequentially flip the wordlines in the array to the positive value by applying ground to the IN node 403, and holding the XR value high.

Next, a wordline select step occurs, in which line 604 of FIG. 6 is set to $V_{DD}$, and the signals XR, XP, and XBL3 are decoded to connect one wordline driver to the PGMNVB voltage. Thus, a supply shift step is executed, which shifts the supply voltage AVX from +5 V to 0 V, and the supply voltage PGMNVB from 0, to −8 V. This shift is executed in a number of steps.

Finally, a program sequence is executed, in which the voltage AVX is 0 V, the voltage AVW is 3 V, and the PGMNVB voltage is −8 V on a selected wordline.

During the read and erase modes, the NAND gate circuitry 602 operates normally in response to the true and complement versions of the signals XP and XBL3 with ground connected at node 604. Thus, a selected wordline (XR high) will receive a low voltage on line 403 which will be passed by transistor MN5 and transistor MN3 of FIG. 5 to node 302. The inverter composed of transistors MP1 and MN1 will drive a high voltage, (AVX) on the wordline 301. A deselected wordline in the read or erase modes will receive a high voltage on line 403 (or have XR low). Thus a high voltage will be passed to node 302 and inverted by transistors MP1 and MN1 to supply a low voltage on line 301.

During a program mode in which selected wordlines are to receive a negative voltage from node 306, the polarity of the decode input signal on line 403 must be reversed. That is, a high value on node 403 will correspond to a selected wordline, while a low value on node 403 will correspond to a deselected wordline. To accomplish this function, the selector 605 is operated to supply $V_{DD}$ to node 604 during the program mode, and the decode signals XPB, XBL3B, and XRB are clamped to ground. In this way as can be seen with reference to FIG. 6, node 603 is decoupled from node 403 during program. In order to pull node 403 up, the signals XP and XBL3 must be high. When they are high, $V_{DD}$ is supplied from selector 602 to node 604 and on to node 403.

When XP or XBL3 are low, then $V_{DD}$ is not coupled to node 403, and node 403 floats. Similarly, the signal XRB will be low, turning off transistor MN4, and preventing a pileup from node 304 to $V_{DD}$. The selected wordline will pass a high value through transistor MN5 in response to the signal XR, pulling up node 302, and supplying the negative voltage PGMNVB from node 306 to the wordline 301. The deselected wordline will be connected to AVX. Thus, care must be taken to ensure that node 302 is pulled down, unless a positive voltage is applied to node 304. This is accomplished by a careful sequence of operation described below. Thus, a two state decoder is used, for which a selected line is supplied a high value on line 304, in the first state (negative voltage decode), and the selected line is supplied a low value on node 304 in the second state (positive voltage decode).

Figure 7:
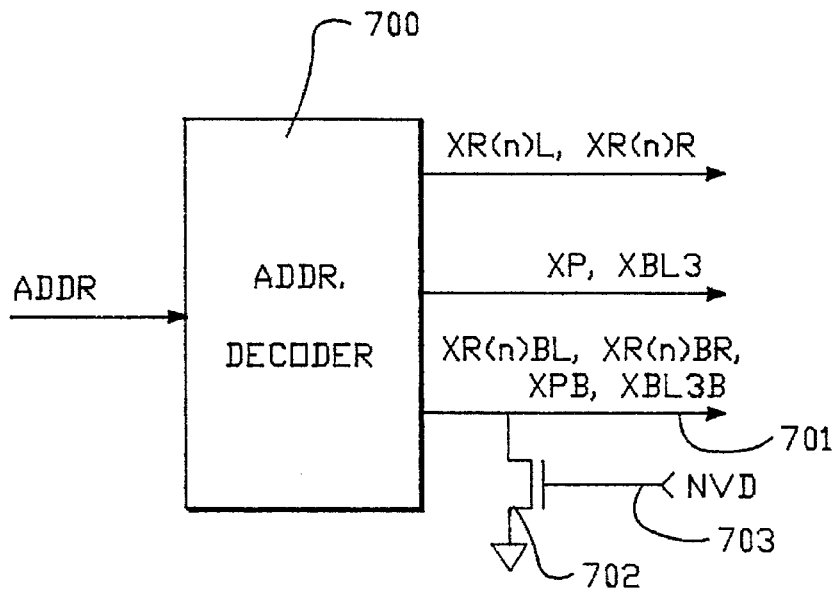
FIG. 7 is an equivalent circuit for the address decoder for use with the circuitry of FIG. 6.

FIG. 7 illustrates an equivalent Circuit for the address decoder supplying the control signals of FIG. 6. As can be seen, the signals XR(N)L, XR(N)R, XP, and XBL3, are supplied directly from the address decoder 700. The signals XPB, XBL3B, XR(N)BR and XR(N)BL are supplied on line 701 by the address decoder 700. A pulldown circuit schematically represented by transistor 702 is controlled by a negative voltage decode signal on line 703. During the negative voltage decoding, the signals on line 701 are pulled down, as is explained above.

In operation, for transition from the read mode to the program mode, a program setup operation is executed to prevent high voltages from appearing across the transistors in the wordline driver and to capture the value of the wordline select signal. The program setup operation includes the following steps:

(1) Wordline Set. During Wordline Set mode, all wordlines are set to the high read voltage $V_{DD}$. To do this, XPB, XBL3B, and XR(N)LB/RB are grounded, the signal AVX is set at 5 volts, AVW is set at 5 volts, PGMNVB is set at 0 volts, and a state machine controls the signals XP and XBL3 to sequentially flip the wordlines in the array to the positive value by applying ground to the IN node 403, and holding the XR value high. This is done sequentially to reduce the magnitude of the transition current needed to set the wordlines.

(2) Wordline select. After the wordlines are all set to the positive value, a single wordline is selected for connecting the node PGMNVB to the wordline. In this state, line 604 of FIG. 6 is set at $V_{DD}$. The signals XRB, XBL3B, and XR(N)LB/RB are grounded. The signals XR, XP, and XBL3 are decoded to select a single wordline driver for connection to PGMNVB.

(3) Supply Shift. In order to shift the supply voltage AVX from +5 to 0 and supply voltage PGMNVB from 0, to −8, a shift sequence is executed. This involves a number of steps after the wordline select. First AVX is lowered from 5 volts to 3 volts. Next, AVW is lowered from 5 volts to 3 volts and PGMNVB is lowered from 0 to −5 volts. Next, AVX is lowered to ground, AVW is left at 3 volts, and PGMNVB is lowered to −5 volts. Next, AVX is left at 0 volts, AVW is left at 3 volts, and PGMNVB is moved to −8 volts.

(4) Program. When AVX is 0 volts, AVW is 3 volts and PGMNVB is −8 volts, a program cycle is executed, by setting the decoder to the negative voltage decode mode.

A program reset sequence is executed to move out of the program mode back to the read mode by changing the values PGMNVB to ground and AVX to +5 volts. In the program reset sequence, the value PGMNVB is switched directly to 0 volts, and AVX is moved up to 3 volts. In the next step, AVW is moved up to 5 volts. Finally, AVX is moved up to 5 volts, leaving the voltages set up for the normal read mode.

The gradual shift in power supply voltages is necessary because of the latch structure of the driver. It is used to gradually shift the power supply voltages to maintain the data at node 302.

As mentioned above, it is necessary to insure that the node 302 is pulled down during the program mode in the event that node 304 is not pulling up the value for deselected wordlines. This is accomplished by the program set-up operation, which establishes a high value on the wordline 301. This turns on transistor MN2, which pulls node 302 down to the value of PGMNVB. Transistor MN2 is relatively weak, compared to the structure 602. Thus, for a selected wordline, when the circuit 602 connects $V_{DD}$ to line 403, it will pull up node 302 to a level sufficient to flip the driver. Else, the driver holds the low input, coupling PGMNVB to node 302.

The signal on line NVSX is controlled to isolate the node 302 from node 403, when node 302 is pulled negative. Thus, during the program mode, the signal NVSX is changed from AVX to PGMNVB. When PGMNVB is negative, it will be at least as negative as node 302, insuring that transistor MN3 is off during the program mode. However, during the program setup, the value of the wordline select signal on line 304 is applied to node 302, and held by the inverter formed by transistors MP2 and MN2.

Figure 8:
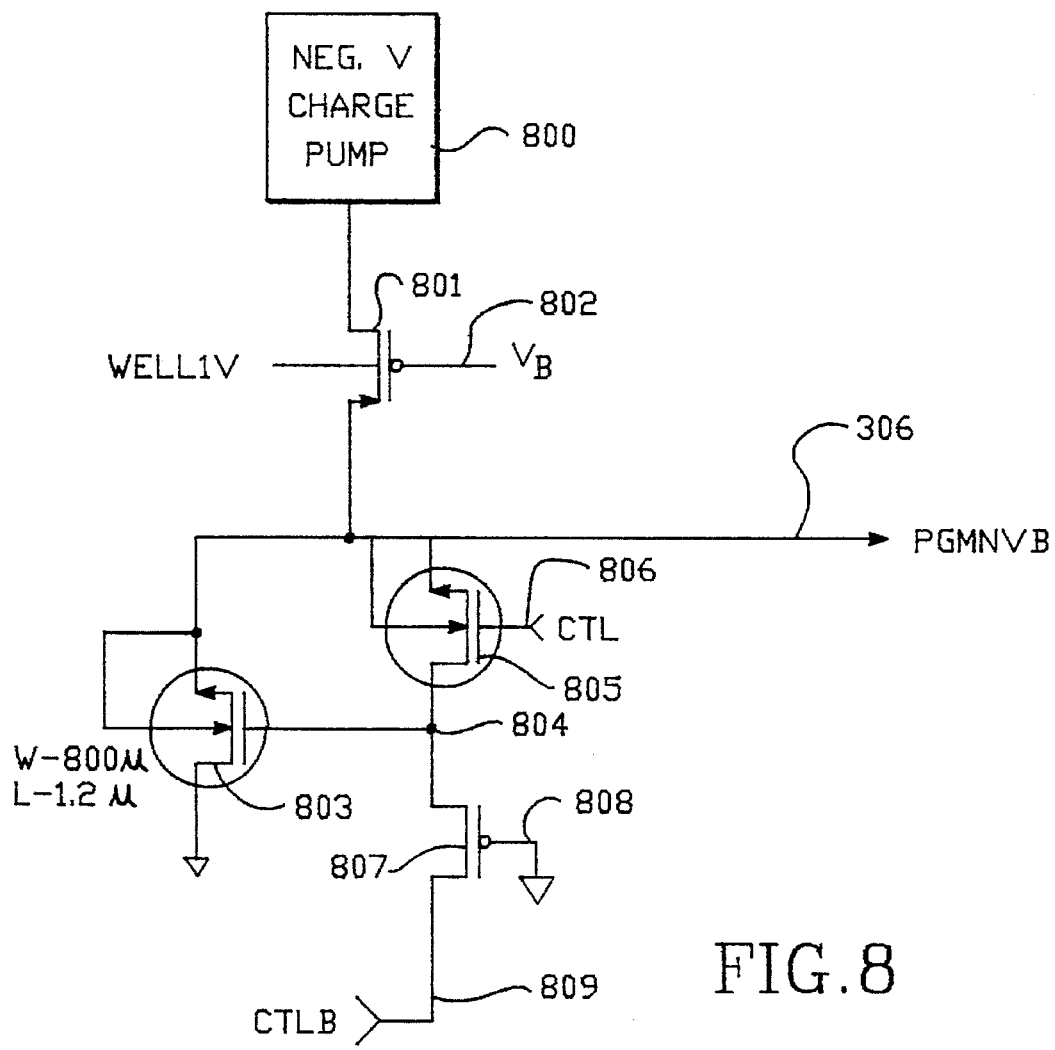
FIG. 8 illustrates a negative voltage or ground voltage selector circuitry for use with the wordline driver of FIG. 5.

FIG. 8 illustrates selector circuitry for supplying either ground or negative voltage to the PGMNVB line 306. In particular, a negative charge pump 800 is connected through a transmission gate 801 to node 306. This transmission gate 801 is a p-channel transistor formed in a n-well biased at about one volt WELL IV, and controlled by the signal $V_B$ on line 802. The source of transistor 801 is connected to node 306 and applies the output of the charge pump circuit 800 to node 306 when $V_B$ is low. The WELLIV level reduces driver stress during negative voltage decodes.

Ground is applied to node 306 through the isolated n-channel transistor 803, which is 800 microns wide and 1.2 microns long. Transistor 803 has its gate connected to node 804. Node 804 is connected to the drain of the isolated n-channel transistor 805 which has its source connected to node 306. The gate of transistor 805 is connected to a control signal CTL on line 806. Node 804 is also connected through p-channel transistor 807 to a control signal CTLB on line 809, which is the complement of the signal on line 806. The gate of p-channel transistor 807 is connected to ground on line 808. Thus, in response to the control signal CTL, node 804 is coupled to line 306, or to line 809. In the normal state, PGMNVB is coupled to ground. Thus, transistor 805 is off, and CTLB on 809 is high. This turns on transistor 803, pulling node 306 to ground. When CTLB goes low, and CTL goes high, transistor 803 is turned off. The signal $V_B$ goes low, connecting the charge pump 800 to node 306. As node 306 goes low, the negative voltage is applied to node 804, keeping transistor 803 off.

Accordingly, a wordline driver suitable for use with flash EEPROM devices has been provided that allows using negative voltage on the wordline in the program mode. This circuitry is efficient, relies on a single charge pump for a large number of wordlines, and is much simpler than prior art designs. The driver is particularly suited to page mode programming flash EEPROM devices, in which the program state corresponds to a discharged floating gate, or a low threshold state for the memory cells.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An apparatus for driving a plurality of wordlines in a memory array, comprising:

a positive voltage source providing a positive voltage;

a negative voltage source providing a negative voltage;

a plurality of wordline voltage drivers, wordline voltage drivers in the plurality having:

respective wordline select inputs, a first mode which selectively drives the positive voltage or a first mode reference voltage to the wordline in response to the wordline select input, a second mode which selectively drives the negative voltage or a second mode reference voltage to the wordline in response to the wordline select input, and a feedback circuit, having an input coupled to the wordline, and having an output coupled to the wordline select input of the driver to hold the wordline select input during the second mode.

2. The apparatus of claim 1, wherein the first and second mode reference voltages are at or near ground potential.

3. The apparatus of claim 1, including:

first supply voltage selector circuitry which supplies the positive voltage to a first supply voltage node during the first mode, and the second mode reference voltage to the first supply voltage node during the second mode; and second supply voltage selector circuitry which supplies the first mode reference voltage to a second supply voltage node during the first mode, and the negative voltage to the second supply voltage node during the second mode; and wherein the wordline voltage drivers in the plurality include a driver circuit, having an input which receives the wordline select signal, and having an output coupled to the wordline, which couples either the first supply voltage node or the second supply voltage node to the wordline in response to a signal on its input.

4. An apparatus for driving a plurality of wordlines in a memory array, comprising:

a positive voltage source providing a positive voltage;

a negative voltage source providing a negative voltage;

a plurality of wordline voltage drivers, wordline voltage drivers in the plurality having respective wordline select inputs, and having a first mode which selectively drives the positive voltage or a first mode reference voltage to the wordline in response to the wordline select input, and second mode which selectively drives the negative voltage or a second mode reference voltage to the wordline in response to the wordline select input;

first supply voltage selector circuitry which supplies the positive voltage to a first supply voltage node during the first mode, and the second mode reference voltage to the first supply voltage node during the second mode; and second supply voltage selector circuitry which supplies the first mode reference voltage to a second supply voltage node during the first mode, and the negative voltage to the second supply voltage node during the second mode; and wherein the wordline voltage drivers in the plurality include a driver circuit, having an input which receives the wordline select signal, and having an output coupled to the wordline, which couples either the first supply voltage node or the second supply voltage node to the wordline in response to a signal on its input; and a source of the wordline select signals, wherein the wordline voltage drivers include:

an isolation circuit, having an input coupled to the source of the wordline select signals and an output connected to the driver circuit, which connects the source of the wordline select signals to its output during the first mode and during a transition between the first and second modes, and isolates the source of the wordline select signals from its output during the second mode; and circuitry which holds the output of the isolation circuit at a level corresponding to the value of the wordline select signal during the second mode.

5. An apparatus for driving a plurality of wordlines in a memory array, comprising:

a positive voltage source providing a positive voltage;

a negative voltage source providing a negative voltage;

a plurality of wordline voltage drivers, wordline voltage drivers in the plurality having respective wordline select inputs, and having a first mode which selectively drives the positive voltage or a first mode reference voltage to the wordline in response to the wordline select input, and second mode which selectively drives the negative voltage or a second mode reference voltage to the wordline in response to the wordline select input;

a first supply voltage selector which supplies the positive voltage to a first supply voltage node during the first mode, and the second mode reference voltage to the first supply voltage node during the second mode; and a second supply voltage selector which supplies the first mode reference voltage to a second supply voltage node during the first mode, and the negative voltage to the second supply voltage node during the second mode; wherein the wordline voltage drivers include:

an inverting driver, having an input which receives the wordline select signal, having an output coupled to the wordline, having a first supply voltage input connected to the first supply voltage node, and having a second supply voltage input connected to the second supply voltage node, which couples the first supply voltage node to the wordline when the wordline select signal is in a low state, and couples the second supply voltage node to the wordline when the wordline select signal is in a high state; and an inverter, having an input coupled to the wordline, and having an output coupled to the input of the inverting driver.

6. The apparatus of claim 5, wherein the inverting driver comprises a p-channel MOS transistor in series with an n-channel MOS transistor, the n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode.

7. The apparatus of claim 5, including a source of the wordline select signal; and wherein the wordline voltage drivers include:

an isolation circuit, having an input coupled to the source of the wordline select signal and an output connected to the inverting driver, which connects the source of the wordline select signal to its output during the first mode and during a transition between the first and second modes, and isolates the source of the wordline select signal from its output during the second mode.

8. The apparatus of claim 7, wherein the inverting driver comprises a p-channel MOS transistor in series with an n-channel MOS transistor, the n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode; and the isolation circuitry comprises a second n-channel MOS transistor, the second n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode.

9. The apparatus of claim 7, wherein the source of the wordline select signal comprises a decoder responsive to a particular address to produce the wordline select signal for the wordline corresponding to the particular address, the decoder supplying a wordline select signal with a low value in response to the particular address in the first mode, and supplying a wordline select signal with a high value in response to the particular address in the second mode.

10. In a memory array including a plurality of wordlines, an apparatus responsive to an address to drive a particular wordline in the plurality of wordlines corresponding to the address with a positive voltage in a first mode and with a negative voltage in a second mode, the apparatus comprising:

a positive voltage source providing a positive voltage;

a negative voltage source providing a negative voltage;

first supply voltage selector circuitry which supplies the positive voltage to a first supply voltage node during the first mode, and a second mode reference voltage to the first supply voltage node during the second mode;

second supply voltage selector circuitry which supplies a first mode reference voltage to a second supply voltage node during the first mode, and the negative voltage to the second supply voltage node during the second mode;

a decoder, receiving the address, and generating a plurality of wordline select signals in response to the address, each of the wordline select signals corresponding to a wordline in the plurality of wordlines; and a plurality of wordline drivers coupled to the decoder and to corresponding wordlines in the plurality of wordlines, the wordline drivers including:

a driver circuit, having an input which receives the corresponding wordline select signal, and having an output coupled to the corresponding wordline, which couples either the first supply voltage node or the second supply voltage node to the corresponding wordline in response to the wordline select signal, and a feedback circuit, having an input coupled to the wordline, and having an output coupled to the wordline select input of the driver to hold the wordline select input during the second mode.

11. In a memory array including a plurality of wordlines, an apparatus responsive to an address to drive a particular wordline in the plurality of wordlines corresponding to the address with a positive voltage in a first mode and with a negative voltage in a second mode, the apparatus comprising:

a positive voltage source providing a positive voltage;

a negative voltage source providing a negative voltage;

first supply voltage selector circuitry which supplies the positive voltage to a first supply voltage node during the first mode, and a second mode reference voltage to the first supply voltage node during the second mode;

second supply voltage selector circuitry which supplies a first mode reference voltage to a second supply voltage node during the first mode, and the negative voltage to the second supply voltage node during the second mode, a decoder, receiving the address, and generating a plurality of wordline select signals in response to the address, each of the wordline select signals corresponding to a wordline in the plurality of wordlines; and a plurality of wordline drivers coupled to the decoder and to corresponding wordlines in the plurality of wordlines, the wordline drivers including a driver circuit, having an input which receives the corresponding wordline select signal, and having an output coupled to the corresponding wordline, which couples either the first supply voltage node or the second supply voltage node to the corresponding wordline in response to the wordline select signal;

wherein the wordline drivers include:

an isolation circuit, having an input coupled to the decoder and an output connected to the driver circuit, which connects the decoder to the driver circuit during the first mode and during a transition between the first and second modes, and isolates the decoder from the driver circuit during the second mode; and circuitry which holds the input of the driver circuit at a level corresponding to the value of the wordline select signal supplied by the decoder during the second mode.

12. In a memory array including a plurality of wordlines, an apparatus responsive to an address to drive a particular wordline in the plurality of wordlines corresponding to the address with a positive voltage in a first mode and with a negative voltage in a second mode, the apparatus comprising:

a positive voltage source providing a positive voltage;

a negative voltage source providing a negative voltage;

first supply voltage selector circuitry which supplies the positive voltage to a first supply voltage node during the first mode, and a second mode reference voltage to the first supply voltage node during the second mode;

second supply voltage selector circuitry which supplies a first mode reference voltage to a second supply voltage node during the first mode, and the negative voltage to the second supply voltage node during the second mode, a decoder, receiving the address, and generating a plurality of wordline select signals in response to the address, each of the wordline select signals corresponding to a wordline in the plurality of wordlines; and a plurality of wordline drivers coupled to the decoder and to corresponding wordlines in the plurality of wordlines, the wordline drivers including a driver circuit, having an input which receives the corresponding wordline select signal, and having an output coupled to the corresponding wordline, which couples either the first supply voltage node or the second supply voltage node to the corresponding wordline in response to the wordline select signal;

wherein the driver circuit comprises:

a first inverter, having an input which receives the wordline select signal, having an output coupled to the wordline, having a first supply voltage input connected to the first supply voltage node, and having a second supply voltage input connected to the second supply voltage node, which couples the first supply voltage node to the wordline when the wordline select signal is in a low state, and couples the second supply voltage node to the wordline when the wordline select signal is in a high state; and a second inverter, having an input coupled to the wordline, and having an output coupled to the input of the first inverter.

13. The apparatus of claim 12, wherein the first inverter comprises a p-channel MOS transistor in series with an n-channel MOS transistor, the n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode.

14. The apparatus of claim 12, wherein the wordline drivers include:

an isolation circuit, having an input coupled to the decoder and an output connected to the input of the first inverter, which connects the decoder to the driver circuit during the first mode and during a transition between the first and second modes, and isolates the decoder from the driver circuit during the second mode.

15. The apparatus of claim 14, wherein the first inverter comprises a p-channel MOS transistor in series with an n-channel MOS transistor, the n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode; and the isolation circuit comprises a second n-channel MOS transistor, the second n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode.

16. The apparatus of claim 12, wherein the decoder includes resources to supply a wordline select signal with a low value in response to the particular address in the first mode, and to supply a wordline select signal with a high value in response to the particular address in the second mode.

17. In a flash EEPROM memory array including a plurality of wordlines, an apparatus responsive to an address to drive a particular wordline in the plurality of wordlines corresponding to the address with a positive voltage in a read mode and with a negative voltage in a program mode, the apparatus comprising:

a positive voltage source providing a positive voltage;

a negative voltage source providing a negative voltage;

first supply voltage selector circuitry which supplies the positive voltage to a first supply voltage node during the read mode, and a program mode reference voltage to the first supply voltage node during the program mode;

second supply voltage selector circuitry which supplies a read mode reference voltage to a second supply voltage node during the read mode, and the negative voltage to the second supply voltage node during the program mode;

a decoder, receiving the address, and generating a plurality of wordline select signals in response to the address, each of the wordline select signals corresponding to a wordline in the plurality of wordlines; and a plurality of wordline drivers coupled to the decoder and corresponding wordlines in the plurality of wordlines, the wordline drivers including:

a driver circuit, having an input which receives a corresponding wordline select signal, having an output coupled to the corresponding wordline, which couples either the first supply voltage node or the second supply voltage node to the corresponding wordline in response to the wordline select signal, and a feedback circuit, having an input coupled to the wordline, and having an output coupled to the wordline select input of the driver to hold the wordline select input during the program mode.

18. In a flash EEPROM memory array including a plurality of wordlines, an apparatus responsive to an address to drive a particular wordline in the plurality of wordlines corresponding to the address with a positive voltage in a read mode and with a negative voltage in a program mode, the apparatus comprising:

a positive voltage source providing a positive voltage;

a negative voltage source providing a negative voltage:

first supply voltage selector circuitry which supplies the positive voltage to a first supply voltage node during the read mode, and a program mode reference voltage to the first supply voltage node during the program mode;

second supply voltage selector circuitry which supplies a read mode reference voltage to a second supply voltage node during the read mode, and the negative voltage to the second supply voltage node during the program mode;

a decoder, receiving the address, and generating a plurality of wordline select signals in response to the address, each of the wordline select signals corresponding to a wordline in the plurality of wordlines; and a plurality of wordline drivers coupled to the decoder and corresponding wordlines in the plurality of wordlines, the wordline drivers including a driver circuit, having an input which receives a corresponding wordline select signal, having an output coupled to the corresponding wordline, which couples either the first supply voltage node or the second supply voltage node to the corresponding wordline in response to the wordline select signal;

wherein the wordline drivers include:

an isolation circuit, having an input coupled to the decoder and an output connected to the driver circuit, which connects the decoder to the driver circuit during the read mode and during a transition between the read and program modes, and isolates the decoder from the driver circuit during the program mode; and circuitry which holds the input of the driver circuit at a level corresponding to the value of the wordline select signal supplied by the decoder during the program mode.

19. In a flash EEPROM memory array including a plurality of wordlines, an apparatus responsive to an address to drive a particular wordline in the plurality of wordlines corresponding to the address with a positive voltage in a read mode and with a negative voltage in a program mode the apparatus comprising:

a positive voltage source providing a positive voltage;

a negative voltage source providing a negative voltage;

first supply voltage selector circuitry which supplies the positive voltage to a first supply voltage node during the read mode, and a program mode reference voltage to the first supply voltage node during the program mode;

second supply voltage selector circuitry which supplies a read mode reference voltage to a second supply voltage node during the read mode, and the negative voltage to the second supply voltage node during the program mode;

a decoder, receiving the address, and generating a plurality of wordline select signals in response to the address, each of the wordline select signals corresponding to a wordline in the plurality of wordlines; and a plurality of wordline drivers coupled to the decoder and corresponding wordlines in the plurality of wordlines, the wordline drivers including a driver circuit, having an input which receives a corresponding wordline select signal, having an output coupled to the corresponding wordline, which couples either the first supply voltage node or the second supply voltage node to the corresponding wordline in response to the wordline select signal;

wherein the driver circuit comprises:

a first inverter, having an input which receives the wordline select signal, having an output coupled to the wordline, having a first supply voltage input connected to the first supply voltage node, and having a second supply voltage input connected to the second supply voltage node, which couples the first supply voltage node to the wordline when the wordline select signal is in a low state, and couples the second supply voltage node to the wordline when the wordline select signal is in a high state; and a second inverter, having an input coupled to the wordline, and having an output coupled to the input of the first inverter.

20. The apparatus of claim 19, wherein the first inverter comprises a p-channel MOS transistor in series with an n-channel MOS transistor, the n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode.

21. The apparatus of claim 19, wherein the wordline drivers include:

an isolation circuit, having an input coupled to the decoder and an output connected to the input of the first inverter, which connects the decoder to the driver circuit during the first mode and during a transition between the first and second modes, and isolates the decoder from the driver circuit during the second mode.

22. The apparatus of claim 21, wherein the first inverter comprises a p-channel MOS transistor in series with an n-channel MOS transistor, the n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode; and the isolation circuit comprises a second n-channel MOS transistor, the second n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode.

23. The apparatus of claim 19, wherein the decoder includes resources to supply a wordline select signal with a low value in response to the particular address in the read mode, and to supply a wordline select signal with a high value in response to the particular address in the program mode.

* * * * *

(12) EX PARTE REEXAMINATION CERTIFICATE (5093rd)
United States Patent
Yiu et al.

(10) Patent Number: US 5,668,758 C1
(45) Certificate Issued: Apr. 5, 2005

(54) DECODED WORDLINE DRIVER WITH POSITIVE AND NEGATIVE VOLTAGE MODES

(75) Inventors: Tom Dang-Hsing Yiu, Milpitas, CA (US); Chun-Hsiung Hung, Hsin-Chu (TW); Ray-Lin Wan, Milpitas, CA (US); Yao-Wu Cheng, Taipei (TW); Teruhiko Kamei, Yokohama (JP)

(73) Assignee: Macronix International Co., Ltd., Hsinchu (TW)

Reexamination Request:
No. 90/006,543, Feb. 10, 2003

Reexamination Certificate for:
Patent No.: 5,668,758
Issued: Sep. 16, 1997
Appl. No.: 08/612,923
Filed: Mar. 5, 1996

(22) PCT Filed: Jan. 26, 1995
(86) PCT No.: PCT/US95/01031
§ 371 (c)(1),
(2), (4) Date: Mar. 5, 1996
(87) PCT Pub. No.: WO96/23307
PCT Pub. Date: Aug. 1, 1996

(51) Int. Cl.[7] .................................................. G11C 7/00
(52) U.S. Cl. .............................. 365/185.23; 365/185.16
(58) Field of Search ........................ 365/185.17, 185.23, 365/185.29, 185.18, 185.28, 230.06, 189.11, 189.09, 185.16, 226

(56) References Cited

U.S. PATENT DOCUMENTS

| | | | |
|---|---|---|---|
| 5,077,691 A | * 12/1991 | Haddad et al. | ........ 365/185.23 |
| 5,157,281 A | 10/1992 | Santin et al. | ............ 307/296.8 |
| 5,357,463 A | * 10/1994 | Kinney | ................... 365/185.22 |
| 5,392,253 A | 2/1995 | Atsumi et al. | ......... 365/230.06 |
| 5,444,664 A | * 8/1995 | Kuroda et al. | ............... 365/226 |
| 5,455,789 A | 10/1995 | Nakamura et al. | ...... 365/185.17 |
| 5,646,060 A | * 7/1997 | Chang et al. | ................ 438/264 |

* cited by examiner

Primary Examiner—Jung H. Hur

(57) ABSTRACT

Wordline driver circuitry drives a plurality of wordlines in a flash EEPROM memory array in a first mode which selects between a positive voltage and ground, and a second mode which selects between a negative voltage and ground. A first supply voltage selector supplies positive voltage during the first mode, and a second mode reference voltage, such as ground, in the second mode. A second supply voltage selector supplies the first mode reference voltage such as ground in the first mode, and the negative voltage during a second mode. An inverting driver has an input which receives a wordline select signal, and an output coupled to the wordline, a first supply voltage input connected to the first supply voltage selector, and second supply voltage input connected to the second supply voltage selector. The inverting driver couples the first supply voltage input to the wordline when the wordline select signal is in a low state, and couples the second supply voltage input to the wordline when the wordline select signal is in a high state. A second inverter is connected in feedback across the inverting driver to hold the input of the inverting driver at the value of the wordline select signal during the negative voltage decode. The wordline select signals come from an address decoder. An isolation circuit is provided between the address decoder and the input to the inverting driver to isolate the decoder from the negative voltages which appear on the output of the second inverter during the negative voltage decoding state.

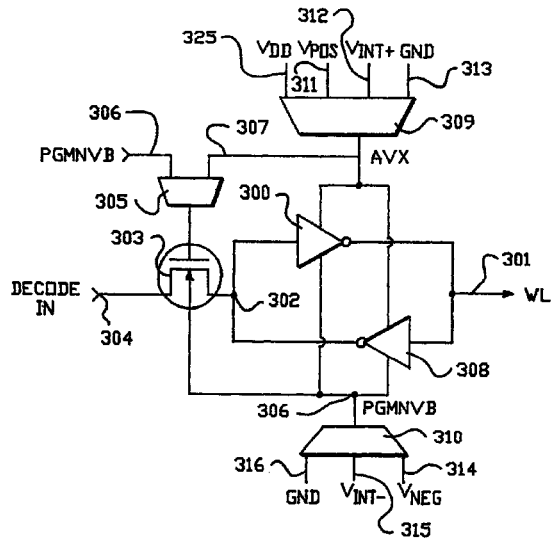

1

EX PARTE
REEXAMINATION CERTIFICATE
ISSUED UNDER 35 U.S.C. 307

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 4, 11 and 18 is confirmed.

Claims 17 and 21 are cancelled.

Claims 1, 5, 10, 12, 19 and 22 are determined to be patentable as amended.

Claims 2, 3, 6, 7, 8, 9, 13, 14, 15, 16, 20 and 23, dependent on an amended claim, are determined to be patentable.

New claims 24, 25 and 26 are added and determined to be patentable.

1. An apparatus for driving a plurality of wordlines in a memory array, comprising:
   a positive voltage source providing a positive voltage;
   a negative voltage source providing a negative voltage;
   a plurality of wordline voltage drivers, wordline voltage drivers in the plurality having:
   respective wordline select inputs,
   a first mode which selectively drives the positive voltage or a first mode reference voltage to the wordline in response to the wordline select input,
   a second mode which selectively drives the negative voltage or a second mode reference voltage to the wordline in response to the wordline select input, [and]
   a feedback circuit, having an input coupled to the wordline, and having an output coupled to the wordline select input of the driver to hold the wordline select input during the second mode; *and*
   *control voltage circuitry and triple well MOS transistor, having a channel in an isolated well, in series between the wordline select input of the driver and a source of wordline select signals, and having a gate coupled to the control voltage circuitry, the control voltage circuitry and the triple well MOS transistor operable to capture wordline select signals and isolate the source of the wordline select signals from the wordline select input of the driver during the second mode.*

5. An apparatus for driving a plurality of wordlines in a memory array, comprising:
   a positive voltage source providing a positive voltage;
   a negative voltage source providing a negative voltage;
   a plurality of wordline voltage drivers, wordline voltage drivers in the plurality having respective wordline select inputs, and having a first mode which selectively drives the positive voltage or a first mode reference voltage to the wordline in response to the wordline select input, and second mode which selectively drives the negative voltage or a second mode reference voltage to the wordline in response to the wordline select input;

a first supply voltage selector which supplies the positive voltage to a first supply voltage node during the first mode, and the second mode reference voltage to the first supply voltage node during the second mode; and
   a second supply voltage selector which supplies the first mode reference voltage to a second supply voltage node during the first mode, *an intermediate voltage to the second supply voltage node during a transition from the first mode to the second mode,* and the negative voltage to the second supply voltage node during the second mode; wherein the wordline voltage drivers include:
   an inverting driver, having an input which receives the wordline select signal, having an output coupled to the wordline, having a first supply voltage input connected to the first supply voltage node, and having a second supply voltage input connected to the second supply voltage node, which couples the first supply voltage node to the wordline when the wordline select signal is in a low state, and couples the second supply voltage node to the wordline when the wordline select signal is in a high state; and
   an inverter, having an input coupled to the wordline, and having an output coupled to the input of the inverting driver.

10. In a memory array including a plurality of wordlines, an apparatus responsive to an address to drive a particular wordline in the plurality of wordlines corresponding to the address with a positive voltage in a first mode and with a negative voltage in a second mode, the apparatus comprising:
   a positive voltage source providing a positive voltage;
   a negative voltage source providing a negative voltage;
   first supply voltage selector circuitry which supplies the positive voltage to a first supply voltage node during the first mode, and a second mode reference voltage to the first supply voltage node during the second mode;
   second supply voltage selector circuitry which supplies a first mode reference voltage to a second supply voltage node during the first mode, *an intermediate voltage during a transition from the first mode to the second mode,* and the negative voltage to the second supply voltage node during the second mode;
   a decoder, receiving the address, and generating a plurality of wordline select signals in response to the address, each of the wordline select signals corresponding to a wordline in the plurality of wordlines; and
   a plurality of wordline drivers coupled to the decoder and to corresponding wordlines in the plurality of wordlines, the wordline drivers including:
   a driver circuit, having an input which receives the corresponding wordline select signal, and having an output coupled to the corresponding wordline, which couples either the first supply voltage node or the second supply voltage node to the corresponding wordline in response to the wordline select signal, and
   a feedback circuit, having an input coupled to the wordline, and having an output coupled to the wordline select input of the driver to hold the wordline select input during the second mode.

12. In a memory array including a plurality of wordlines, an apparatus responsive to an address to drive a particular wordline in the plurality of wordlines corresponding to the address with a positive voltage in a first mode and with a negative voltage in a second mode, the apparatus comprising:

a positive voltage source providing a positive voltage;

a negative voltage source providing a negative voltage;

first supply voltage selector circuitry which supplies the positive voltage to a first supply voltage node during the first mode, and a second mode reference voltage to the first supply voltage node during the second mode;

second supply voltage selector circuitry which supplies a first mode reference voltage to a second supply voltage node during the first mode, *an intermediate voltage during a transition from the first mode to the second mode,* and the negative voltage to the second supply voltage node during the second mode, a decoder, receiving the address, and generating a plurality of wordline select signals in response to the address, each of the wordline select signals corresponding to a wordline in the plurality of wordlines; and a plurality of wordline drivers coupled to the decoder and to corresponding wordlines in the plurality of wordlines, the wordline drivers including a driver circuit, having an input which receives the corresponding wordline select signal, and having an output coupled to the corresponding wordline, which couples either the first supply voltage node or the second supply voltage node to the corresponding wordline in response to the wordline select signal;

wherein the driver circuit comprises:

a first inverter, having an input which receives the wordline select signal, having an output coupled to the wordline, having a first supply voltage input connected to the first supply voltage node, and having a second supply voltage input connected to the second supply voltage node, which couples the first supply voltage node to the wordline when the wordline select signal is in a low state, and couples the second supply voltage node to the wordline when the wordline select signal is in a high state; and a second inverter, having an input coupled to the wordline, and having an output coupled to the input of the first inverter.

19. In a flash EEPROM memory array including a plurality of wordlines, an apparatus responsive to an address to drive a particular wordline in the plurality of wordlines corresponding to the address with a positive voltage in a read mode and with a negative voltage in a program mode the apparatus comprising:

a positive voltage source providing a positive voltage;

a negative voltage source providing a negative voltage;

first supply voltage selector circuitry which supplies the positive voltage to a first supply voltage node during the read mode, and a program mode reference voltage to the first supply voltage node during the program mode;

second supply voltage selector circuitry which supplies a read mode reference voltage to a second supply voltage node during the read mode, and the negative voltage to the second supply voltage node during the program mode;

a decoder, receiving the address, and generating a plurality of wordline select signals in response to the address, each of the wordline select signals corresponding to a wordline in the plurality of wordlines; and a plurality of wordline drivers coupled to the decoder and corresponding wordlines in the plurality of wordlines, the wordline drivers including a driver circuit, having an input which receives a corresponding wordline select signal, having an output coupled to the corresponding wordline, which couples either the first supply voltage node or the second supply voltage node to the corresponding wordline in response to the wordline select signal;

wherein the driver circuit comprises:

a first inverter, having an input which receives the wordline select signal, having an output coupled to the wordline, having a first supply voltage input connected to the first supply voltage node, and having a second supply voltage input connected to the second supply voltage node, which couples the first supply voltage node to the wordline when the wordline select signal is in a low state, and couples the second supply voltage node to the wordline when the wordline select signal is in a high state; [and]

a second inverter, having an input coupled to the wordline, and having an output coupled to the input of the first inverter; *and*

*an isolation circuit, having an input coupled to the decoder and an output connected to the input of the first inverter, which connects the decoder to the driver circuit during the first mode and during a transition between the first and second modes, and isolates the decoder from the driver circuit during the second mode.*

22. The apparatus of claim [21] *19*, wherein the first inverter comprises a p-channel MOS transistor in series with an n-channel MOS transistor, the n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode; and the isolation circuit comprises a second n-channel MOS transistor, the second n-channel MOS transistor comprising n-type source and drain diffusion regions within a p-type well, the p-type well within an n-type well, the n-type well in a p-type substrate, the n-type well coupled to a supply voltage to isolate the p-type well, during at least the second mode.

*24. The apparatus of claim 4, wherein the isolation circuit comprises an MOS transistor, and a control voltage selector, which applies a voltage to the gate of the MOS transistor during the first mode that leaves the MOS transistor in a conducting state, and applies a voltage to the gate of the MOS transistor during the second mode that is at least as negative as the negative voltage.*

*25. The apparatus of claim 11, wherein the isolation circuit comprises an MOS transistor, and a control voltage selector, which applies a voltage to the gate of the MOS transistor during the first mode that leaves the MOS transistor in a conducting state, and applies a voltage to the gate of the MOS transistor during the second mode that is at least as negative as the negative voltage.*

*26. The apparatus of claim 18, wherein the isolation circuit comprises an MOS transistor, and a control voltage selector, which applies a voltage to the gate of the MOS transistor during the first mode that leaves the MOS transistor in a conducting state, and applies a voltage to the gate of the MOS transistor during the second mode that is at least as negative as the negative voltage.*

\* \* \* \* \*